United States Patent
Nuber

(10) Patent No.: US 6,936,986 B2
(45) Date of Patent: Aug. 30, 2005

(54) DEVICE FOR SENSING AN OBSTACLE IN THE OPENING RANGE OF A POWERED CLOSURE ELEMENT FOR A MOTOR VEHICLE

(75) Inventor: Roland Nuber, Lindau (DE)

(73) Assignee: Metzeler Automotive Profile Systems GmbH, Lindau (DE)

( * ) Notice: Subject to any disclaimer, the term of this patent is extended or adjusted under 35 U.S.C. 154(b) by 0 days.

(21) Appl. No.: 10/459,346

(22) Filed: Jun. 11, 2003

(65) Prior Publication Data

US 2003/0233183 A1 Dec. 18, 2003

(30) Foreign Application Priority Data

Jun. 12, 2002 (DE) .......................................... 102 26 133

(51) Int. Cl.⁷ ................................................. H02H 7/08
(52) U.S. Cl. ...................... 318/445; 318/266; 318/286; 340/870.37; 340/562; 324/658; 324/686
(58) Field of Search ................................ 318/266, 286, 318/445, 476; 340/870.37, 562; 324/658, 686, 674; 49/26, 28

(56) References Cited

U.S. PATENT DOCUMENTS

| 4,016,490 A | | 4/1977 | Weckenmann et al. ... 324/61 R |
| 4,796,013 A | * | 1/1989 | Yasuda et al. ............... 340/562 |
| 5,537,109 A | * | 7/1996 | Dowd ..................... 340/870.37 |
| 6,051,981 A | | 4/2000 | Gershenfeld et al. ........ 324/663 |
| 6,723,933 B2 | * | 4/2004 | Haag et al. ............... 200/61.42 |
| 6,750,624 B2 | * | 6/2004 | Haag et al. .................. 318/467 |
| 6,823,730 B2 | * | 11/2004 | Buck et al. ................ 73/304 C |
| 6,825,752 B2 | * | 11/2004 | Nahata et al. .............. 340/5.64 |

FOREIGN PATENT DOCUMENTS

| CH | 49 862 A | 8/1966 |
| DE | 296 16 654 U1 | 9/1996 |
| DE | 29616654 U1 | 1/1998 |
| DE | 199 13 105 A1 | 3/1999 |
| DE | 19913105 A1 | 10/2000 |
| DE | 102 20 725 C1 | 4/2003 |
| EP | 1 154 110 A2 | 11/2001 |

* cited by examiner

*Primary Examiner*—Rita Leykin
(74) *Attorney, Agent, or Firm*—Stephen B. Salai, Esq.; Brian B. Shaw, Esq.; Harter, Secrest & Emery LLP

(57) ABSTRACT

A device for sensing an obstacle in the opening range of a movable closure element of a motor vehicle, more particularly an electrically powered window pane or sunroof is defined. The device is provided with at least one sensor electrode generating an electrical field in the opening range of the closure element. It is furthermore provided with a control unit for detecting a change in the capacitance of the electrical field caused by the presence of an obstacle in the opening range of the closure element, the control unit providing a control signal for a drive powering the closure element. The sensor electrode is connected to the control unit either directly or via a shielded conductor. The control unit is arranged on an electronic controller of the drive and compensates the influence of the shielded conductor on the electrical field.

9 Claims, 2 Drawing Sheets

DEVICE FOR SENSING AN OBSTACLE IN THE OPENING RANGE OF A POWERED CLOSURE ELEMENT FOR A MOTOR VEHICLE

CROSS-REFERENCE TO RELATED APPLICATIONS

This application claims priority of German Patent Application Number 102 26 133.4, filed Jun. 12, 2002.

STATEMENT REGARDING FEDERALLY SPONSORED RESEARCH OR DEVELOPMENT

Not Applicable

REFERENCE TO A "SEQUENCE LISTING"

Not Applicable

BACKGROUND OF THE INVENTION

1. Field of the Invention

The invention relates to a device for sensing an obstacle in the opening range of a powered movable closure element of a motor vehicle, more particularly an electrically powered window pane or sunroof. The device is provided with at least one sensor electrode generating an electrical field in the opening range of the closure element. In addition, the device is provided with a control unit for detecting a change in the capacitance of the sensor electrode caused by a change of the electrical field as a result of the presence of an obstacle in the opening range of the closure element and for providing a control signal for a drive powering the closure element.

2. Background Art

Devices of this kind are guards serving to prevent part of the human body being trapped between a powered window pane and at least some part of the edge surrounding the window pane. For this purpose known devices feature a sensor which senses the presence of an obstacle in the opening range of the window pane representing a closure element and furnishes a signal controlling the drive powering the window pane. As regards the function of the sensor a distinction is made between guards requiring physical contact with the obstacle such as, for example, as described in DE 199 13 105 A1 and guards working by proximity (non-contact) sensing.

Known from EP 1 154 110 A2 is a proximity or non-contact type guard. The way in which this guard works is based on a change in capacitance of an electrical field generated between two electrical conductors prompted by an electrically conducting obstacle. One of the two conductors, the sensor electrode, is integrated in a weatherseal sealing the closure element and receives a predefined electrical charge. In this way a reference capacitance can be determined between the sensor electrode and the other conductor, the basic electrode, which, for example, may be grounded. The change in the reference capacitance due to the obstacle is detected by means of a control unit which furnishes a control signal for a drive powering the closure element.

Furthermore, DE 296 16 654 U1 reveals a device for sensing obstacles that includes a sensor consisting of a piezoelectrical cable connected to a control unit. The piezoelectrical cable produces an electrical tension signal in case of radial as well as axial pressure or strain, the electrical tension signal being proportional to the force produced by the pressure or strain. If such force is produced by an obstacle, for example in the opening range of a gate or window pane, a signal controlling the gate or the window pane can be produced by the control unit.

BRIEF SUMMARY OF THE INVENTION

The invention is based on the objective to further the creation of a device for sensing an obstacle in the opening range of a powered movable closure element of a motor vehicle in such way that easy assembly and obtaining a pure measuring result are made possible.

This objective is achieved for a device having the features as set forth at the outset as it reads from claim 1 in accordance with the invention, in that the sensor electrode is connected to the control unit by a shielded conductor, the control unit being arranged at an electronic controller of the drive and compensating the effect of the shielded conductor on the electrical field.

Providing a shielded conductor enables the control unit to be secured spatially independently of the sensor electrode. The conductor featuring a capacitance as a function of merely the length as a result of the shielding has roughly the same effect on the electrical field generated by the sensor electrode, in thus making it directly possible to electronically compensate the effect of the shielded conductor on the electrical field by the control unit.

The control unit directly connected to the electronic controller of the drive can be arranged together with the electronic controller and the drive for example in the door of the motor vehicle. A cable connecting the control unit to the electronic controller is not needed, thus resulting in a simple and cost-effective solution to its fabrication. This applies all the more so when the cable connecting the control unit to the electronic controller is expediently provided with a strain-relief of at least 50 N to satisfy the requirements of professional assembly in thus eliminating the complications in design associated with such a strain-relief. In addition, arranging the control unit directly on the electronic controller of the drive ensures a short path for the control signal furnished by the control unit in contributing towards the high reliability and accuracy of the control signal.

Advantageous further embodiments of the device in accordance with the invention are as set forth in claims 2 to 5.

Advantageously, the control unit is preferably grounded via the drive so as not to influence the electrical field generated by the sensor electrode.

Preferably the shielded conductor is connected to the electronic controller by means of a connector to ensure facilitated assembly.

In another advantageous aspect of the arrangement in accordance with the invention the control unit is integrated in the connector. Such a configuration makes it possible to prefabricate the module consisting of the shielded conductor, connector, control unit and—depending on the application—also the sensor electrode for cost-effective fabrication.

In conclusion, it is proposed as an alternative further embodiment of the arrangement in accordance with the invention to integrate the control unit in the electronic controller of the drive. In this case a module consisting of the shielded conductor, connector, control unit and, where necessary, also the sensor electrode in thus involving exclusively mechanical components can be prefabricated by simple ways and means. In addition, the control unit and the electronic controller, for example, can be arranged on one and the same circuit board to make for a compact configuration.

BRIEF DESCRIPTION OF THE SEVERAL VIEWS OF THE DRAWING(S)

Further details and advantages of the arrangement in accordance with the invention will now be described by way of example embodiments with reference to the drawings illustrating the example embodiments merely diagrammatically in which.

DETAILED DESCRIPTION OF THE INVENTION

Figure 1:
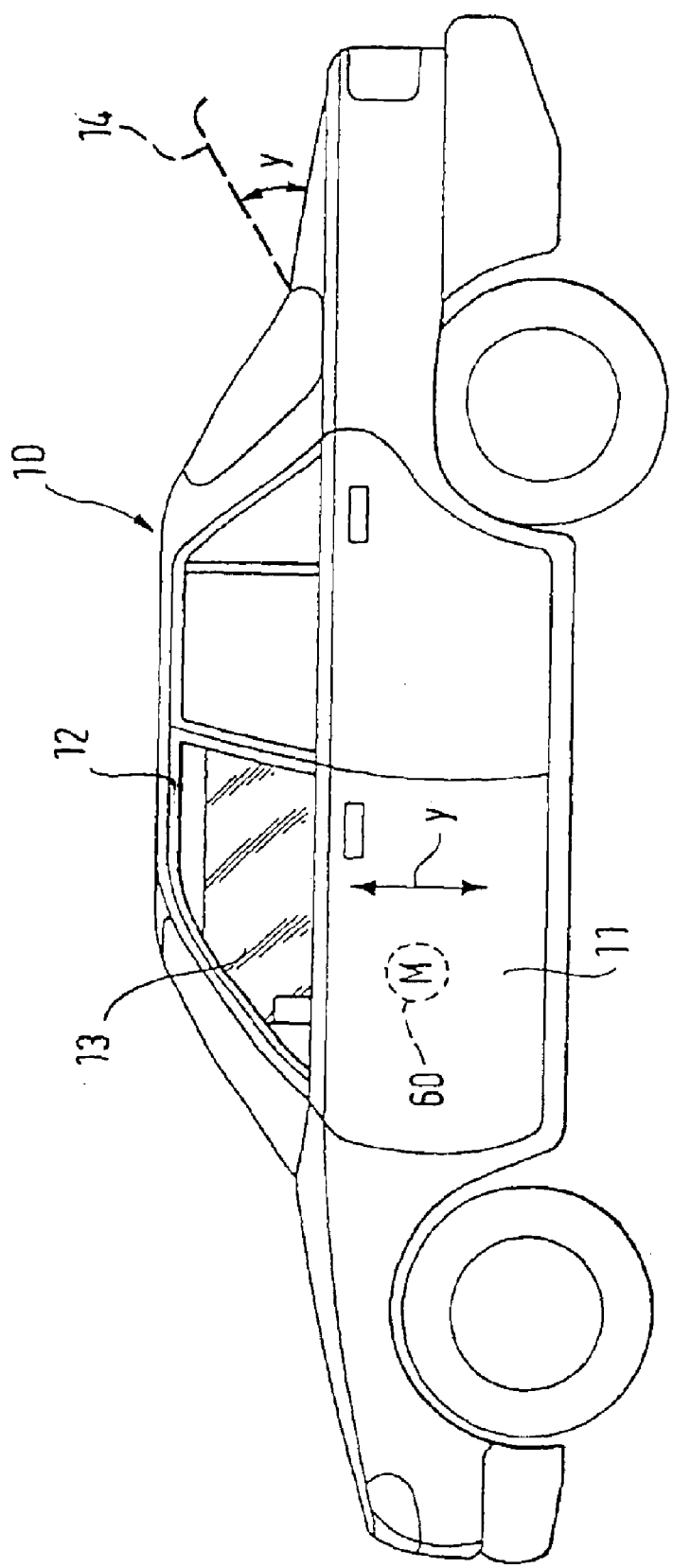
FIG. 1 is a side view of a motor vehicle.

Referring now to FIG. 1 there is illustrated a motor vehicle 10 provided in the region of a front door 11 with a window pane 13 powered by an electric motor 60. The window pane 13 representing a closure element is powered in the direction y of the electric motor 60 between an open position and its closed position defined by a frame 12 of the front door 11. Secured to the frame 12 is a weatherseal (not shown) for sealing the window pane 13. Embedded in the weatherseal, made of an elastomer, for example EPDM, is a sensor electrode 20 as is described in EP 1 154 110 A2. The sensor electrode 20 serves to generate an electrical field in the opening range of the window pane 13. The grounded frame 12 or some other grounded conductor represents the necessary opposite electrode. A control unit connected to the sensor electrode 20 detects the change in capacitance prompted by an electrically conductive obstacle in the region of the electrical field at the sensor electrode 20 and furnishes as a function of this change a control signal for the electric motor 60 which halts the electric motor 60 when needed.

Figure 2:
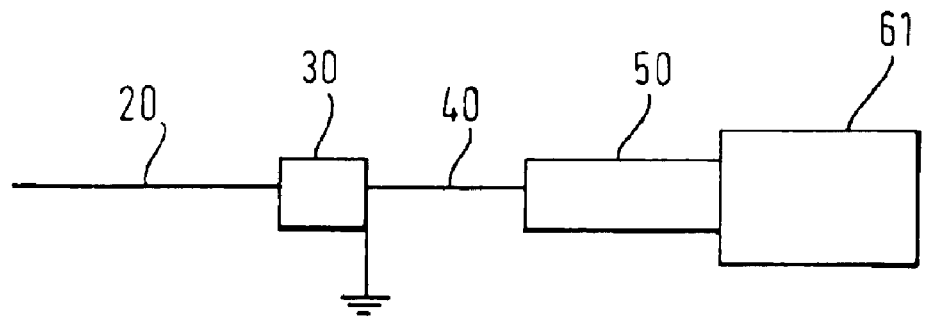
FIG. 2 is a diagrammatic illustration of a device for sensing an obstacle.

In the embodiment as shown in FIG. 2 the sensor electrode 20 is directly connected to the control unit 30. The control unit 30 is grounded and connected by a cable 40 to an electronic controller 61 of the drive 60. The cable 40 comprises at its end facing away from the control unit 30 a connector 50 serving to releasably terminate the cable 40 at an electronic controller 61 of the electric motor 60 in thus making it possible to prefabricate the module comprising the control unit 30, cable 40 and connector 50 for connection to the electronic controller 61 of the electric motor 60 and the sensor electrode 20 embedded in the weatherseal on assembly of the motor vehicle 10. As an alternative, the prefabricated module may also include the sensor electrode 20. Such a configuration is expedient, for example, when the sensor electrode 20 is not embedded in the weatherseal sealing the window pane 13 but arranged on a trim item or the like.

Figure 3:
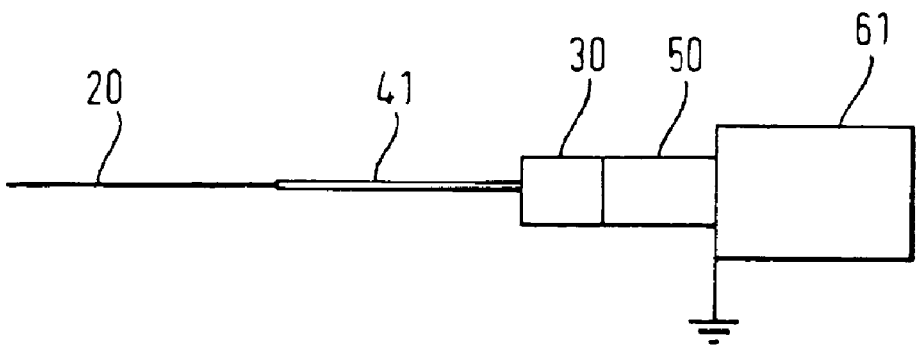
FIG. 3 is a diagrammatic illustration of a first embodiment of the device in accordance with the invention.

Referring now to FIG. 3 there is illustrated an embodiment in which the sensor electrode 20 is connected to the control unit 30 by a shielded conductor 41. The control unit 30 is integrated in the connector 50 arranged at the end of the shielded conductor 41 facing away from the sensor electrode 20. The control unit 30 thus directly connected to the electronic controller 61 of the electric motor 60 in this way is grounded by the electric motor 60. The shielded conductor 41, the connector 50 including the control unit 30 and, where necessary, the sensor electrode 20 may all be configured as prefabricated module.

Figure 4:
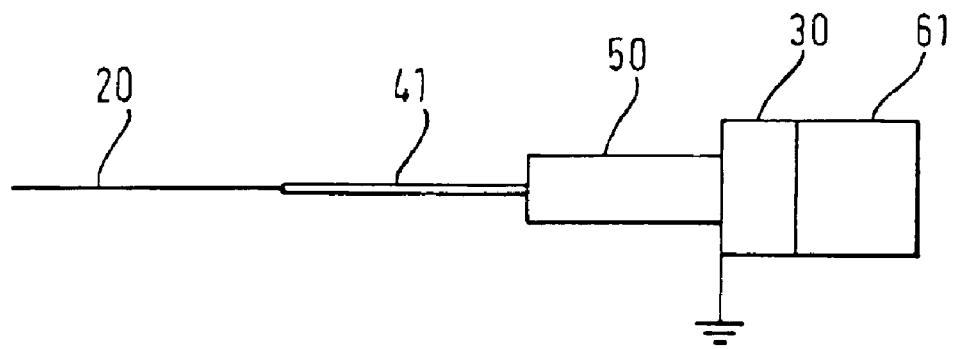
FIG. 4 is a diagrammatic illustration of a second embodiment of the device in accordance with the invention.

Referring now to FIG. 4 there is illustrated an embodiment which mainly differs from that as shown in FIG. 3 by the control unit 30 not being integrated in the connector 50 but in the electronic controller 61 in thus enabling the sensor electrode 20, the shielded conductor 41 and the connector 50 to be prefabricated as a module comprising exclusively mechanical components. The control unit 30 and the electronic controller 61 are located in the direct vicinity of the electric motor 60 on one and the same circuit board.

The embodiments as described above of a device for sensing an obstacle in the opening range of the window pane 13 powered by the electric motor 60 in the motor vehicle 10 represent a trap guard, which may find application for example on a sunroof, a sliding door, hatchback or trunk lid 14 of the motor vehicle 10. Common to all devices is that the sensor electrode 20 can now be located so that an electrical field is generated in the opening range of the window pane 13 or trunk lid 14 or some other closure element of the motor vehicle 10. However, the arrangements differ by the way in which the sensor electrode 20 is connected to the control unit 30 detecting the change in capacitance of the electrical field as prompted by the existence of an obstacle in the opening range of the window pane 13. The device as shown in FIG. 2 is characterized by the control unit 30 being directly arranged on the sensor electrode 20. By contrast, in the devices as shown in FIGS. 3 and 4 in which the control unit 30 is directly arranged on the electronic controller 61, it is necessary that the capacitance caused by the shielded conductor 41 is compensated when detecting the change in capacitance of the electrical field. However, due to the shielding, the influence exercised on the electrical field by the shielded conductor 41 is practically constant so that electronic compensation by the sensor electrode 20 is relatively simple to achieve.

Last but not least, providing the connector 50 in each device as shown in FIGS. 2 to 4 makes for a non-contact type trap guard permitting simple assembly and cost-effective fabrication.

What is claimed is:

1. A device for sensing an obstacle in the opening range of a movable closure element of a motor vehicle, comprising:

at least one sensor electrode; said sensor electrode being configured to generate an electrical field in the opening range of said closure element;

a control unit; said control unit being configured to detect a change in the capacitance of the electrical field caused by the presence of an obstacle in the opening range of said closure element and to provide a control signal for a drive powering said closure element;

said sensor electrode being connected to said control unit by a shielded conductor;

said shielded conductor being connected to an electronic controller of said drive by means of a connector;

said control unit being integrated in said connector; and said control unit being configured to compensate the influence of said shielded conductor on said electrical field.

2. The device as set forth in claim 1, wherein said control unit is grounded.

3. The device as set forth in claim 2, wherein said control unit is grounded by said drive.

4. The device as set forth in claim 1, wherein said movable closure element is an electrically powered window pane or sunroof.

5. A device for sensing an obstacle in the opening range of a movable closure element of a motor vehicle, comprising:

at least one sensor electrode; said sensor electrode being configured to generate an electrical field in the opening range of said closure element;

a control unit; said control unit being configured to detect a change in the capacitance of the electrical field caused by the presence of an obstacle in the opening range of said closure element and to provide a control signal for a drive powering said closure element;

said sensor electrode being connected to said control unit by a shielded conductor;

said control unit being integrated in an electronic controller of said drive; and said control unit being configured to compensate the influence of said shielded conductor on said electrical field.

6. The device as set forth in claim 5, wherein said control unit is grounded.

7. The device as set forth in claim 6, wherein said control unit is grounded by said drive.

8. The device as set forth in claim 5, wherein said shielded conductor is connected to said electronic controller by means of a connector.

9. The device as set forth in claim 5, wherein said movable closure element is an electrically powered window pane or sunroof.

* * * * *

(12) EX PARTE REEXAMINATION CERTIFICATE (6883rd)
United States Patent
Nuber

(10) Number: US 6,936,986 C1
(45) Certificate Issued: Jun. 16, 2009

(54) DEVICE FOR SENSING AN OBSTACLE IN THE OPENING RANGE OF A POWERED CLOSURE ELEMENT FOR A MOTOR VEHICLE

(75) Inventor: Roland Nuber, Lindau (DE)

(73) Assignee: Metzeler Automotive Profile Systems GmbH, Lindau (DE)

Reexamination Request:
No. 90/009,136, May 6, 2008

Reexamination Certificate for:
Patent No.: 6,936,986
Issued: Aug. 30, 2005
Appl. No.: 10/459,346
Filed: Jun. 11, 2003

(30) Foreign Application Priority Data

Jun. 12, 2002 (DE) .................................. 102 26 133

(51) Int. Cl.
*H02H 7/08* (2006.01)

(52) U.S. Cl. .................... 318/445; 318/266; 318/286
(58) Field of Classification Search ...................... None
See application file for complete search history.

(56) References Cited

U.S. PATENT DOCUMENTS 6,499,359 B1    12/2002    Washeleski et al.

FOREIGN PATENT DOCUMENTS

EP              1154110 A2 *  11/2001

* cited by examiner

*Primary Examiner*—Linh My Nguyen

(57) ABSTRACT

A device for sensing an obstacle in the opening range of a movable closure element of a motor vehicle, more particularly an electrically powered window pane or sunroof is defined. The device is provided with at least one sensor electrode generating an electrical field in the opening range of the closure element. It is furthermore provided with a control unit for detecting a change in the capacitance of the electrical field caused by the presence of an obstacle in the opening range of the closure element, the control unit providing a control signal for a drive powering the closure element. The sensor electrode is connected to the control unit either directly or via a shielded conductor. The control unit is arranged on an electronic controller of the drive and compensates the influence of the shielded conductor on the electrical field.

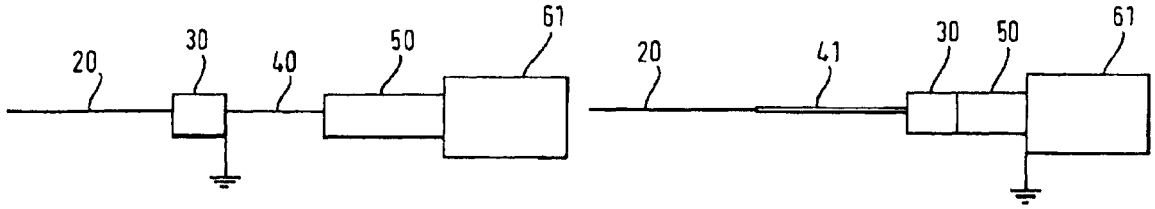

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 5 are determined to be patentable as amended.

Claims 2–4 and 6–9, dependent on an amended claim, are determined to be patentable.

1. A device for sensing an obstacle in the opening range of a movable closure element of a motor vehicle, comprising:
   at least one sensor electrode; said sensor electrode being configured to generate an electrical field in the opening range of said closure element;
   a control unit; said control unit being configured to detect a change in the capacitance of the electrical field caused by the presence of an obstacle in the opening range of said closure element and to provide a control signal for a drive powering said closure element;
   said sensor electrode being connected to [said control unit by] a shielded conductor *connecting said sensor electrode directly to said control unit*;
   said shielded conductor being connected to an electronic controller of said drive by means of a connector;
   said control unit being integrated in said connector; and
   said control unit being configured to compensate the influence of said shielded conductor on said electrical field.

5. A device for sensing an obstacle in the opening range of a movable closure element of a motor vehicle, comprising:
   at least one sensor electrode; said sensor electrode being configured to generate an electrical field in the opening range of said closure element;
   a control unit; said control unit being configured to detect a change in the capacitance of the electrical field caused by the presence of an obstacle in the opening range of said closure element and to provide a control signal for a drive powering said closure element;
   said sensor electrode being connected to [said control unit by] a shielded conductor *connecting said sensor electrode directly to said control unit*;
   said control unit being integrated in an electronic controller of said drive; and
   said control unit being configured to compensate the influence of said shielded conductor on said electrical field.

* * * * *